United States Patent
Komukai et al.

(10) Patent No.: US 7,479,433 B2
(45) Date of Patent: Jan. 20, 2009

(54) METHOD FOR MANUFACTURING SEMICONDUCTOR DEVICE

(75) Inventors: Toshiaki Komukai, Kawasaki (JP); Hideaki Harakawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 160 days.

(21) Appl. No.: 11/418,071

(22) Filed: May 5, 2006

(65) Prior Publication Data

US 2006/0270131 A1    Nov. 30, 2006

(30) Foreign Application Priority Data

May 23, 2005   (JP)   ............................. 2005-149741

(51) Int. Cl.
*H01L 21/336* (2006.01)
(52) U.S. Cl. .................. 438/301; 438/622; 438/626; 438/633; 438/638; 257/E21.232; 257/E21.257
(58) Field of Classification Search .................. None
See application file for complete search history.

(56) References Cited

U.S. PATENT DOCUMENTS 6,313,025 B1 * 11/2001 Chittipeddi et al. ......... 438/622
6,627,540 B2 *  9/2003 Lee ............................. 438/638

FOREIGN PATENT DOCUMENTS

JP    2002-164355    6/2002

* cited by examiner

*Primary Examiner*—N Drew Richards
*Assistant Examiner*—Kyoung Lee
(74) *Attorney, Agent, or Firm*—Finnegan, Henderson, Farabow, Garrett & Dunner, L.L.P.

(57) ABSTRACT

A method of manufacturing a semiconductor device includes depositing a mask material to be patterned into a desired target pattern on an underlying material; patterning the mask material into a preparatory pattern including the target pattern and being larger than the target pattern; patterning the mask material into the target pattern; and processing the underlying material by using the mask material, which has been patterned, as a mask.

14 Claims, 19 Drawing Sheets

10 ··· SILICON SUBSTRATE  52 ··· SILICON NITRIDE FILM
20 ··· STI  62 ··· AMORPHOUS SILICON FILM
30 ··· GATE INSULATION FILM  92 ··· PHOTORESIST MASK
42 ··· POLYSILICON LAYER

METHOD FOR MANUFACTURING SEMICONDUCTOR DEVICE

CROSS-REFERENCE TO RELATED APPLICATION

This application is based upon and claims the benefit of priority from the prior Japanese Patent Applications No. 2005-149741, filed on May 23, 2005, the entire contents of which are incorporated herein by reference.

BACKGROUND OF THE INVENTION

1. Field of the Invention

The present invention relates to a method of manufacturing a semiconductor device.

2. Related Art

A manufacturing process of a semiconductor device includes a step of shaping a mask material in a desired pattern (to be also referred to as patterning hereinafter). In this step, a mask material is patterned by using a photolithography technique and etching. As ordinary etching for a mask material, an RIE (Reactive Ion Etching) method as an anisotropic etching is used.

However, depending on the density of a pattern, a reaction product obtained by etching adheres to a base portion of a patterned mask material. For example, when a silicon nitride film is anisotropically etched as a mask material to pattern a gate electrode, a quantity of the reaction product adheres to a lower side-wall portion of the silicon nitride film in a region in which the pattern density of the gate electrode is low. For this reason, the width of the gate electrode disadvantageously changes depending on the density of the pattern. This causes variations in characteristic of semiconductor devices.

SUMMARY OF THE INVENTION

A method of manufacturing a semiconductor device according to an embodiment of the invention comprises depositing a mask material to be patterned into a desired target pattern on an underlying material; patterning the mask material into a preparatory pattern including the target pattern and being larger than the target pattern; patterning the mask material into the target pattern; and processing the underlying material by using the mask material, which has been patterned, as a mask.

DETAILED DESCRIPTION OF THE INVENTION

Embodiments of the present invention will be described below with reference to the accompanying drawings. The embodiments do not limit the present invention.

FIRST EMBODIMENT

FIGS. 1 to 6 are sectional views showing a method of manufacturing a semiconductor device according to the first embodiment of the present invention. In the first embodiment, an offset spacer (to be referred to as a spacer hereinafter) is formed on a side surface of a gate electrode, and a source-drain layer is formed by using the spacer as a mask.

Figure 1:
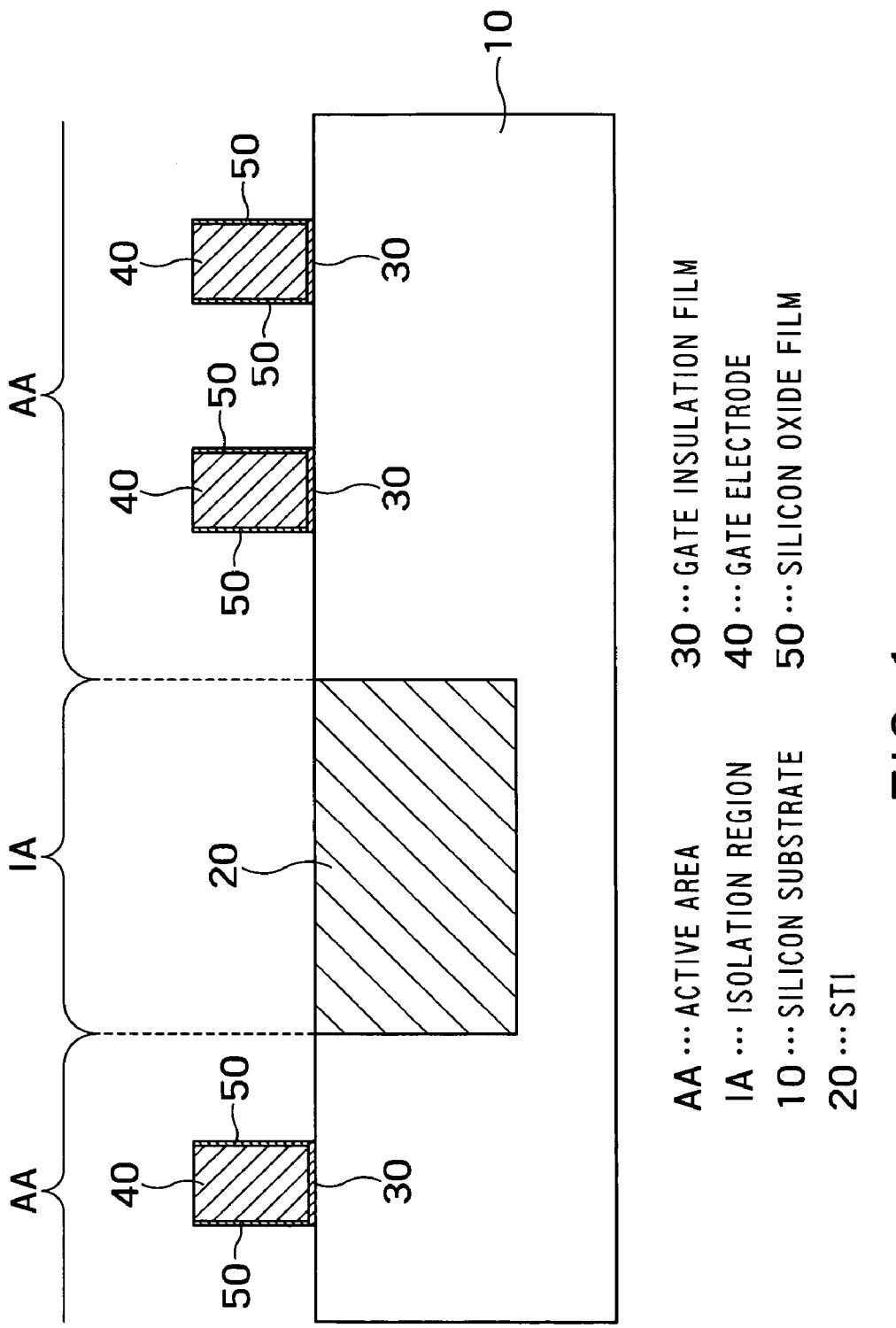
FIGS. 1 to 6 are sectional views showing a method of manufacturing a semiconductor device according to the first embodiment of the present invention.
Figure 2:
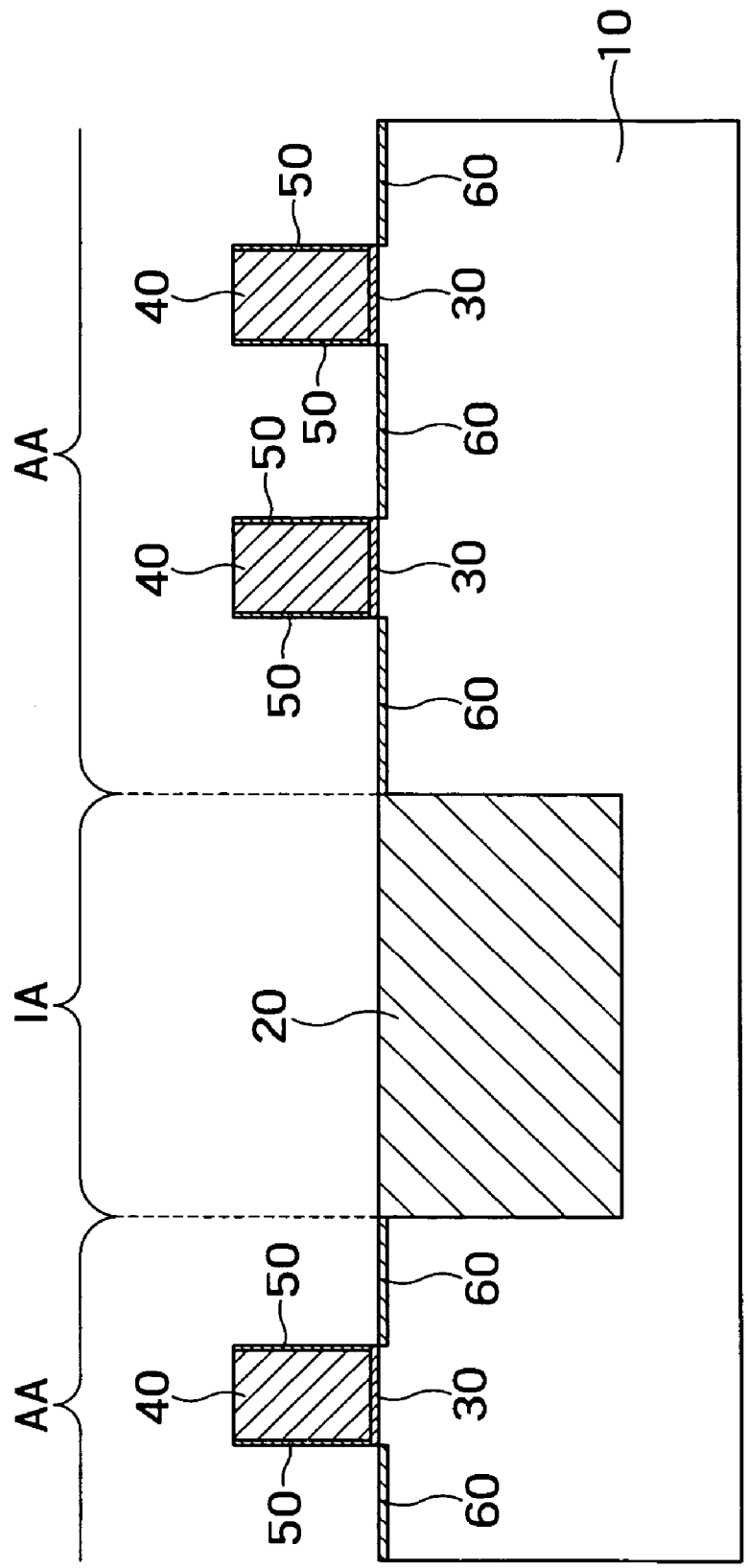

A silicon substrate 10 is prepared as a semiconductor substrate. As shown in FIG. 1, an STI (Shallow Trench Isolation) 20 as an isolation region IA is formed on the silicon substrate 10. In this manner, active areas AA isolated from each other by the STI 20 are formed as element forming regions.

A gate insulation film 30 is formed on the surface of the active areas AA, and a gate electrode 40 is formed on the gate insulation film 30. More specifically, a silicon oxide film is formed on the active area AA as a material of the gate insulation film 30, and a polysilicon layer is deposited on the silicon oxide film as a material of the gate electrode 40. The polysilicon layer and the silicon oxide film are etched in a pattern of the gate electrode 40 by using a photolithography technique and RIE. In this manner, the gate insulation film 30 and the gate electrode 40 are formed. In this case, the gate insulation film 30 is formed in the active areas AA in a high-density pattern. On the other hand, the gate insulation film 30 is formed in the isolation region IA in a low-density pattern. In FIG. 1, three patterns of the gate insulation film 30 are shown in the active areas AA. However, a large number of gate electrode patterns are actually formed on the active areas AA.

Thin silicon oxide films 50 are formed on side surfaces of the gate electrode 40. Impurity ions are implanted into the surface of the silicon substrates 10 of either side of the gate electrode 40 by using the silicon oxide films 50 as masks. In this manner, extension layers 60 are formed.

Figure 3:
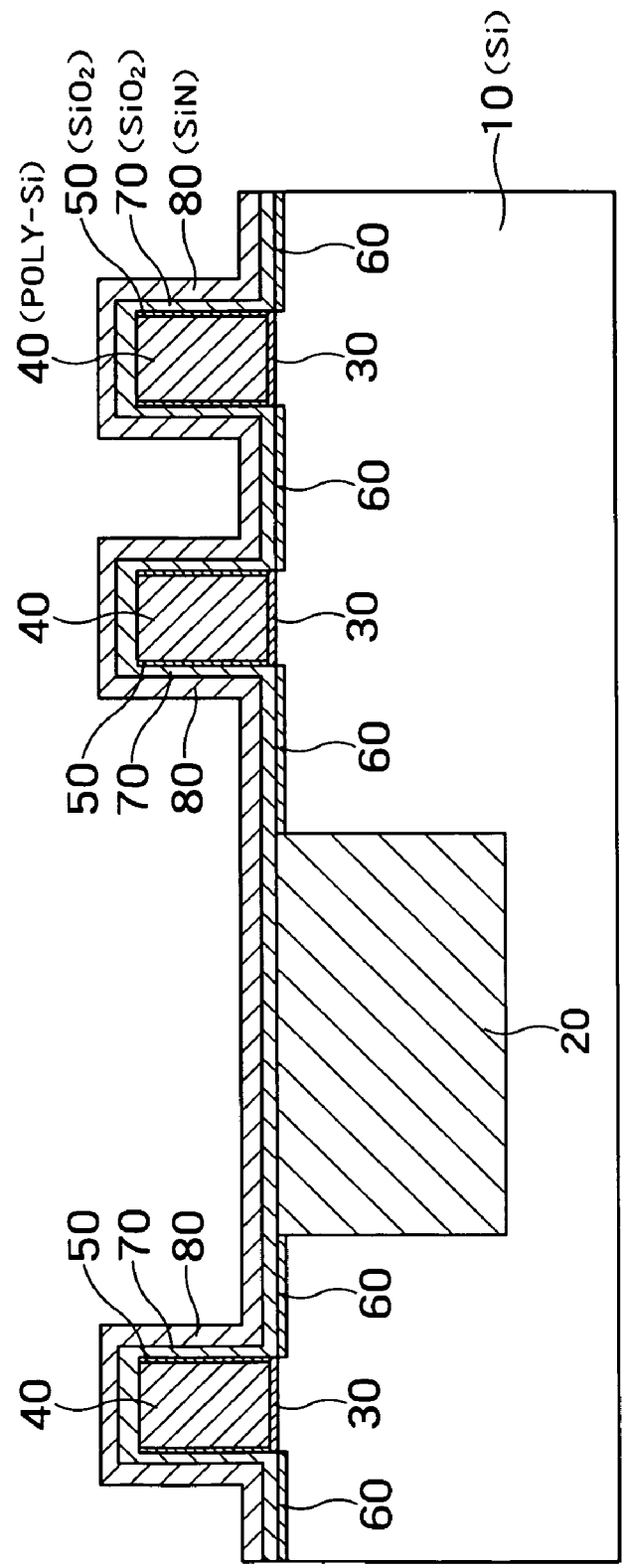

As shown in FIG. 3, a silicon oxide film 70 and a silicon nitride film 80 serving as mask materials are deposited on the upper surfaces of the gate electrodes 40, the side surfaces of the gate electrodes 40, and the surface of the silicon substrate 10.

Figure 4:
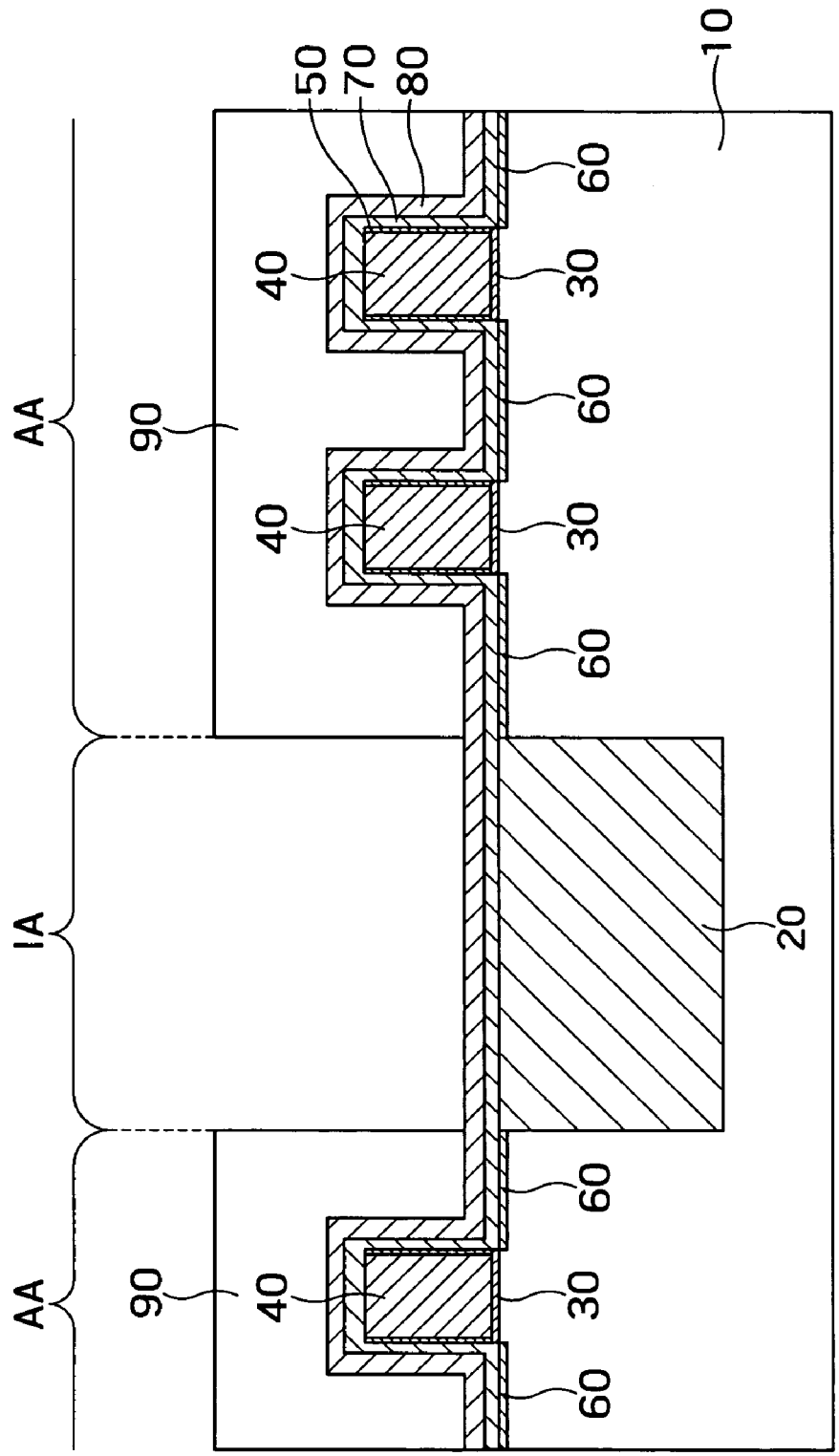

A photoresist film 90 is coated on the silicon substrate 10. Furthermore, as shown in FIG. 4, only the photoresist film 90 on the STI 20 is removed, and the photoresist film 90 is patterned by a photolithography technique such that the photoresist film 90 is left on the active areas AA.

Figure 5:
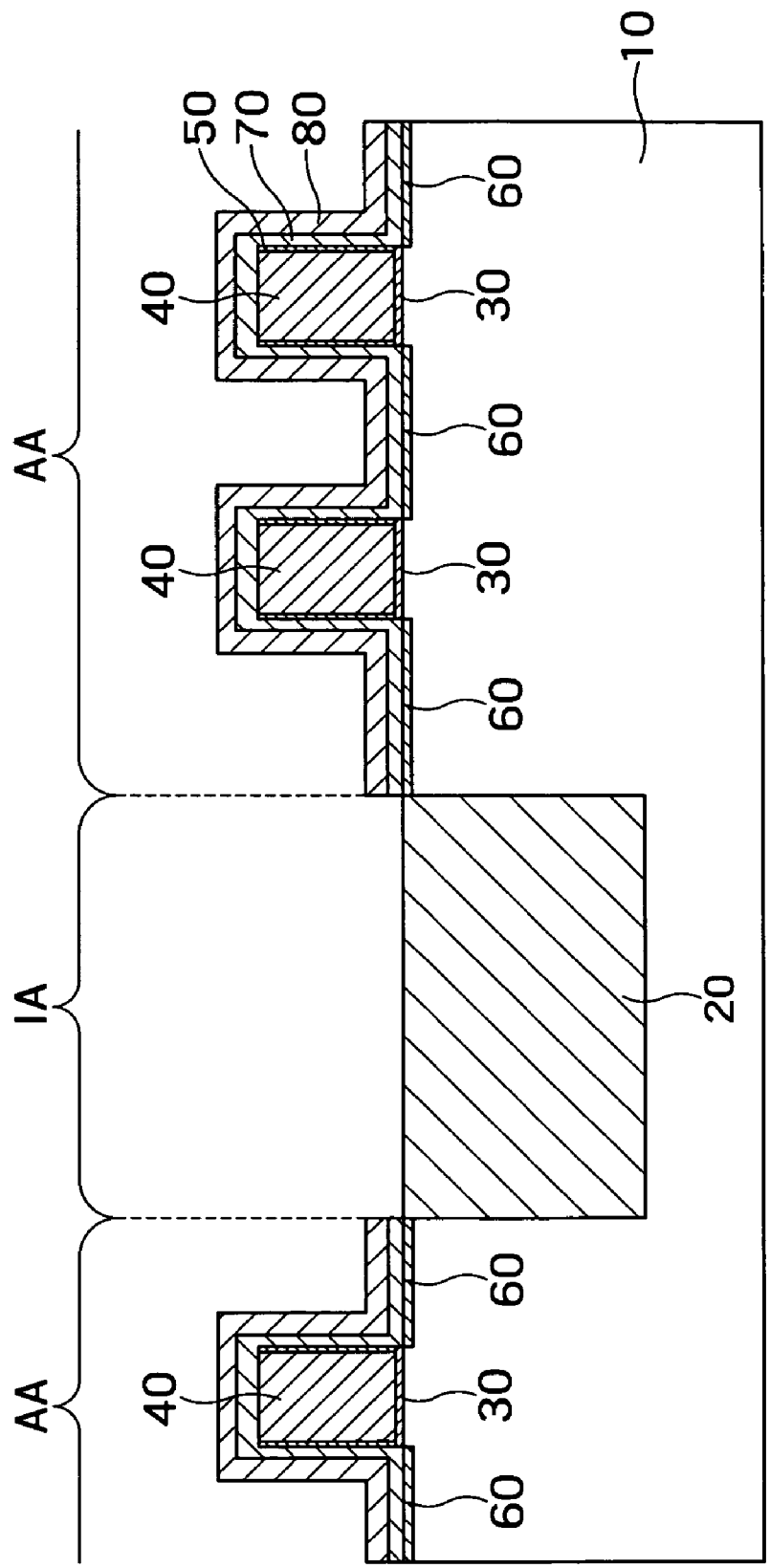

The silicon nitride film 80 on the STI 20 is anisotropically etched by RIE using the patterned photoresist films 90 as masks. In this manner, the silicon nitride film 80 is patterned. Furthermore, the silicon oxide film 70 on the STI 20 is etched by RIE using the silicon nitride film 80 as a mask, so that the silicon oxide film 70 is patterned. As a result, as shown in FIG. 5, the silicon oxide film 70 and the silicon nitride film 80 serving as the mask materials expose the STI 20 and cover the silicon substrate 10 in the active areas AA. The patterns of the silicon oxide film 70 and the silicon nitride film 80 at this time are defined as preparatory patterns. The preparatory pattern includes the gate electrode 40 serving as a target pattern and covers a region larger than the gate electrode 40.

In the step of forming the preparatory pattern, the silicon oxide film 70 and the silicon nitride film 80 on the isolation regions IA (STI 20) are removed. This is because the extension layer 60 may be excessively etched, if the silicon oxide film 70 and the silicon nitride film 80 on the silicon substrate 10 were removed. In the step of forming the preparatory pattern, the photomask used in the step of forming the STI 20 can be additionally used without being changed. For this reason, an increase in manufacturing cost can be suppressed to a low level.

Figure 6:
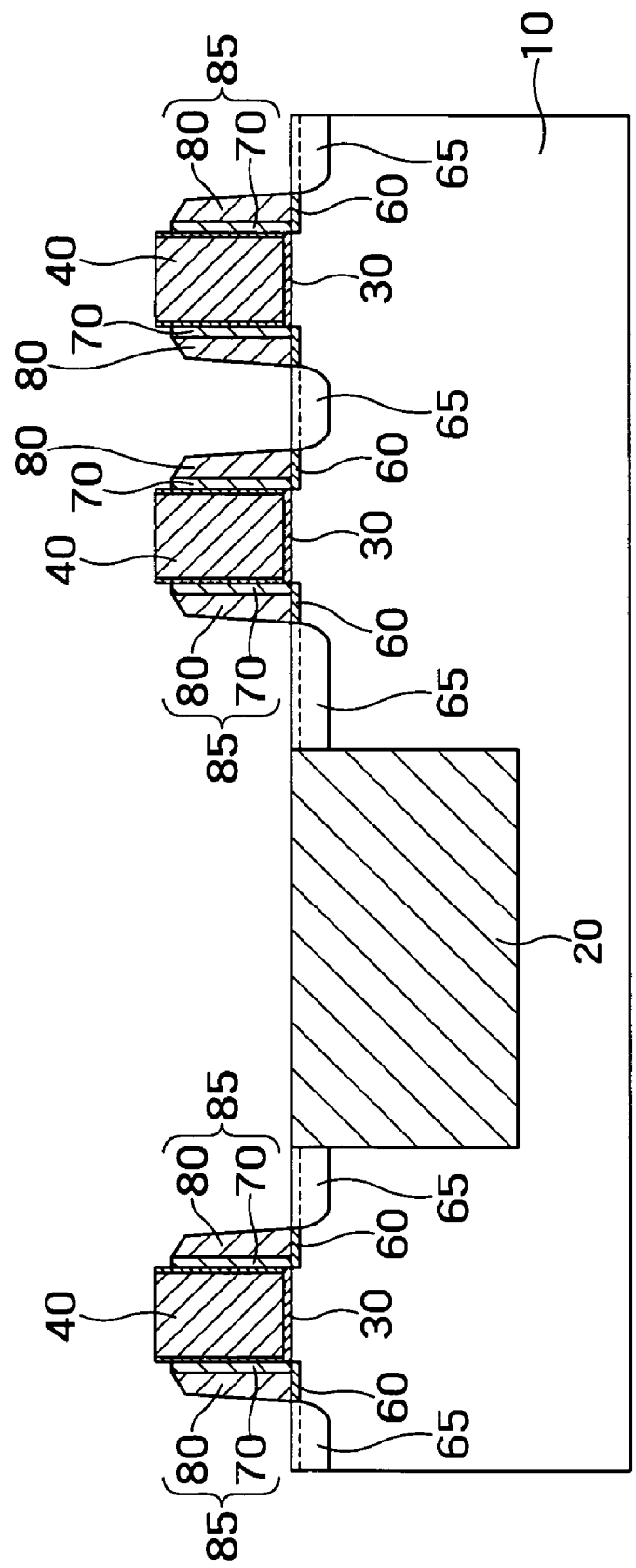
Figure 7:
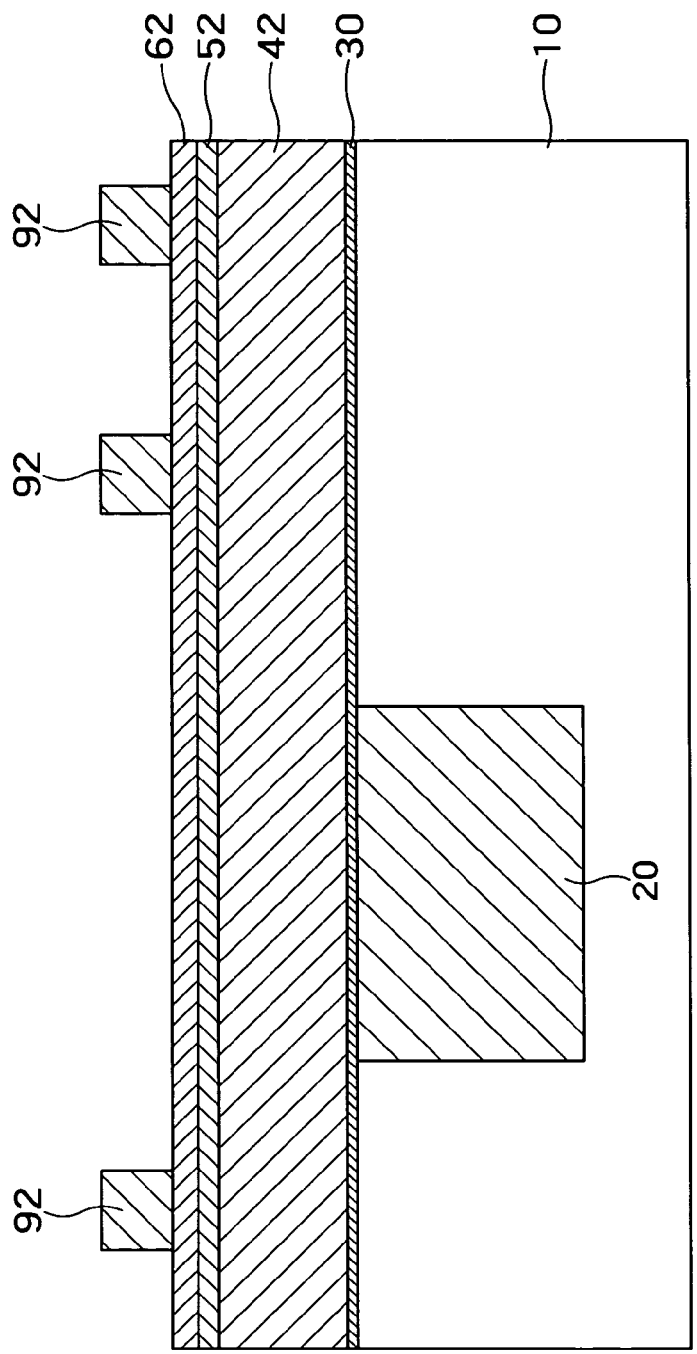
FIGS. 7 to 12 are sectional views showing a method of manufacturing a semiconductor device according to the second embodiment of the present invention.

The silicon oxide film 70 and the silicon nitride film 80 are anisotropically etched by RIE. In this manner, as shown in FIG. 6, a spacer 85 constituted by the silicon oxide film 70 and the silicon nitride film 80 is formed on a side surface of the gate electrode 40. The pattern of the spacer 85 (the silicon oxide film 70 and the silicon nitride film 80) obtained at this step is a target pattern. Furthermore, impurity ions are implanted into the silicon substrate 10 by using the spacer 85 as a mask. In this manner, a source and drain layers 65 are formed. Thereafter, a protecting film and a contact (both of them are not shown) are formed by using a known method, so that a semiconductor device is completed.

In a conventional technique, after the silicon oxide film 70 and the silicon nitride film 80 are deposited on the entire surface of the silicon substrate 10 (see FIG. 3), the silicon oxide film 70 and the silicon nitride film 80 are etched in one step to form a spacer 85. In this process, a reaction product (not shown) generated by reacting an etching gas of the RIE and the silicon nitride film adheres to the lower end (base portion) of the spacer 85 in the active area AA. For example, $CHF_3$—$O_2$, $C_4F_8$—$O_2$, and the like adhere as the reaction product. In the isolation regions IA having a low pattern density, since an amount of mask material to be etched is large, the reaction products are generated in large quantity. For this reason, the reaction product adheres to the lower end of the spacer 85, and the region of the extension layer 60 is displaced from a desired position. As a result, the characteristics of the semiconductor devices in the active areas AA are different from each other.

In the first embodiment, before the spacer 85 is formed, the silicon oxide film 70 and the silicon nitride film 80 in the isolation region IA (STI 20) are removed in advance. Then, the silicon oxide film 70 and the silicon nitride film 80 are etched to form the spacer 85. Thus, the mask materials are etched in two steps to reduce an amount of reaction product generated when the spacer 85 is formed. Therefore, the reaction product does not adhere to the lower end of the spacer 85 regardless of the density of the pattern. Therefore, the spacer 85 can be uniformly formed on the side surface of the gate electrode 40. As a result, the extension layer 60 is formed at a desired position, the characteristics of the semiconductor devices are stabilized.

SECOND EMBODIMENT

FIGS. 7 to 12 are sectional views showing a method of manufacturing a semiconductor device according to the second embodiment of the present invention. In the second embodiment, a gate electrode is formed by using a mask consisting of a silicon nitride film.

As in the first embodiment, an STI 20 is formed on a silicon substrate 10. A silicon oxide film 30 is formed on the silicon substrate 10 as a gate insulation film. A polysilicon layer 42, a silicon nitride film 52, and an amorphous silicon film 62 are deposited on the silicon substrate 10 in this order. The polysilicon layer 42 is used as a gate electrode material. The silicon nitride film 52 and the amorphous silicon film 62 are used as mask materials. Furthermore, a photoresist mask 92 is formed in gate electrode patterns by using a photolithography technique.

Figure 8:
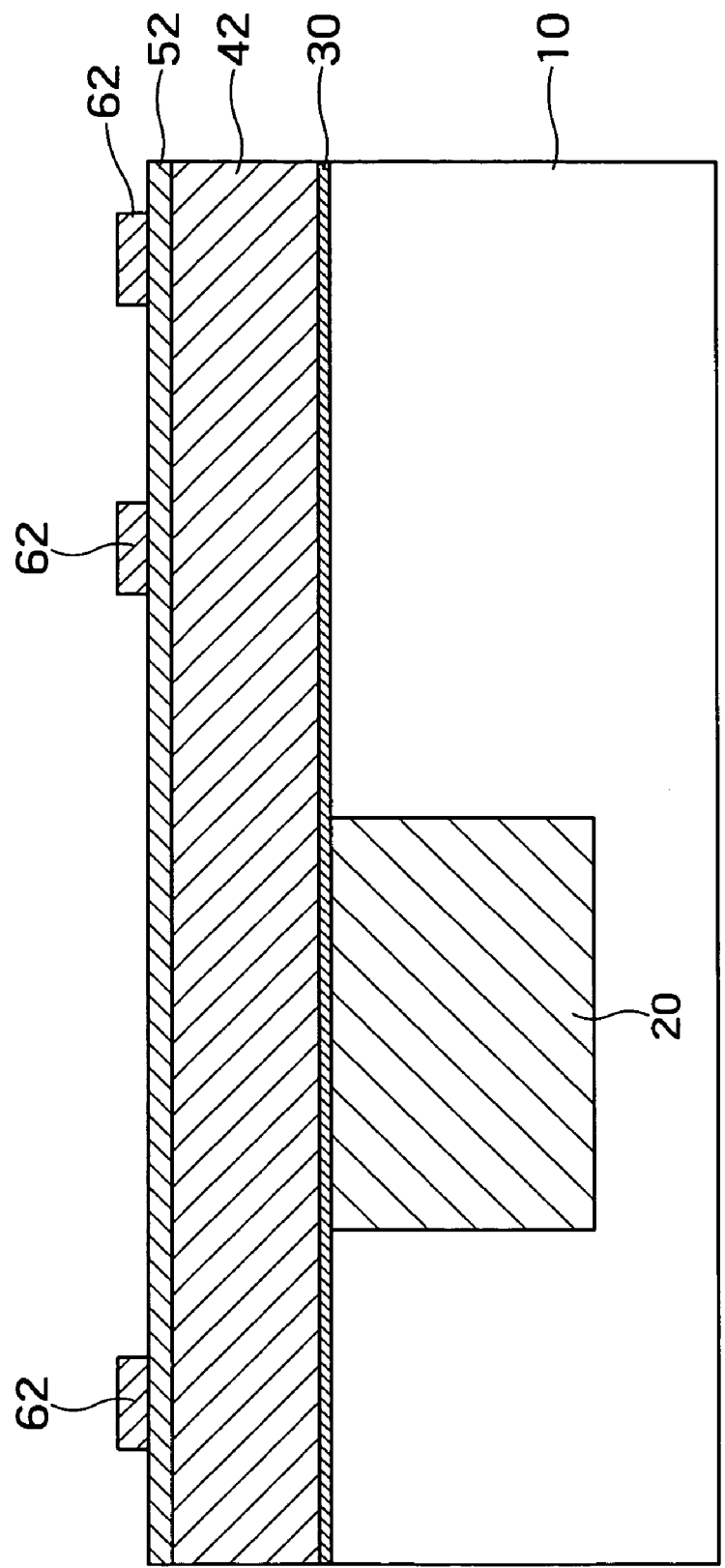

As shown in FIG. 8, the amorphous silicon film 62 is etched by using the photoresist mask 92. The amorphous silicon does not easily generate a product in reaction with an etching gas of RIE. Therefore, the amorphous silicon film 62 may be shaped in the gate electrode pattern by performing etching once.

Figure 9:
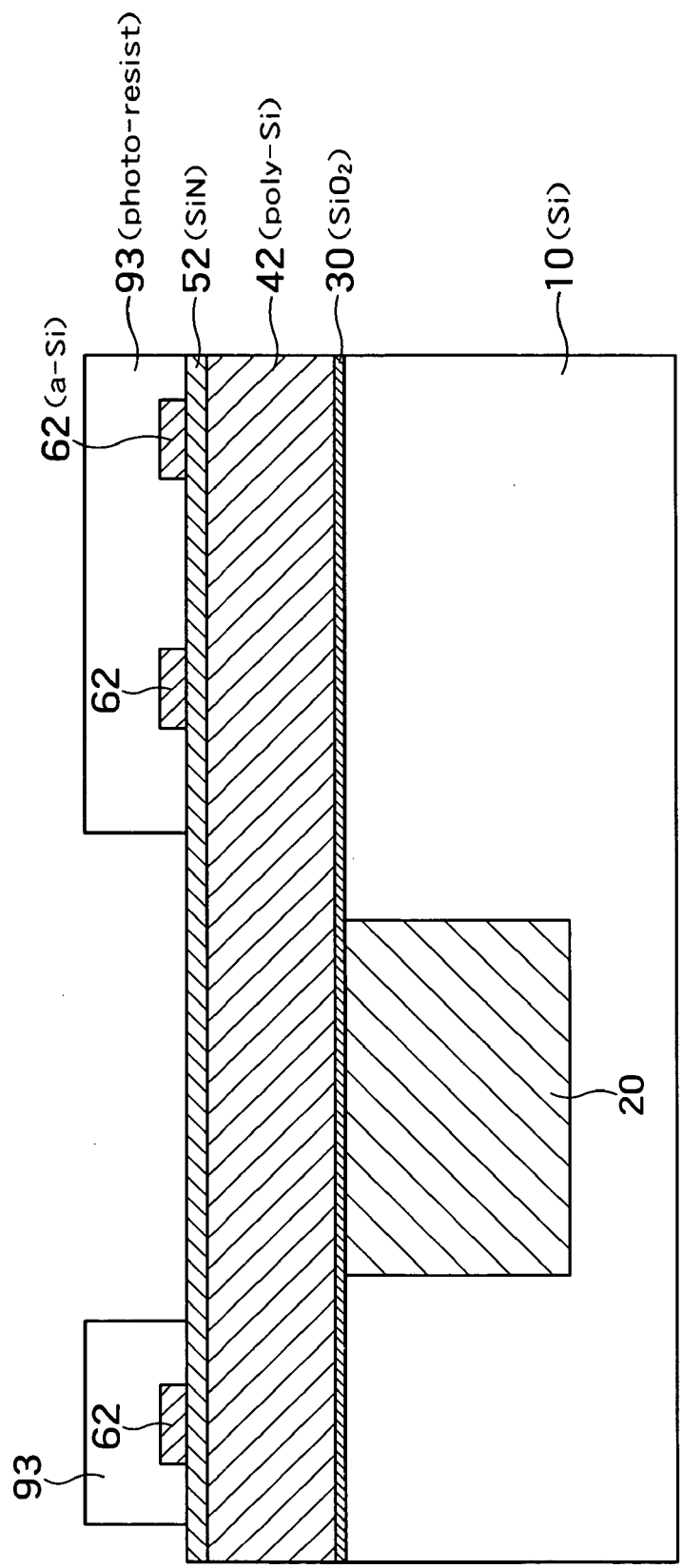
Figure 10:
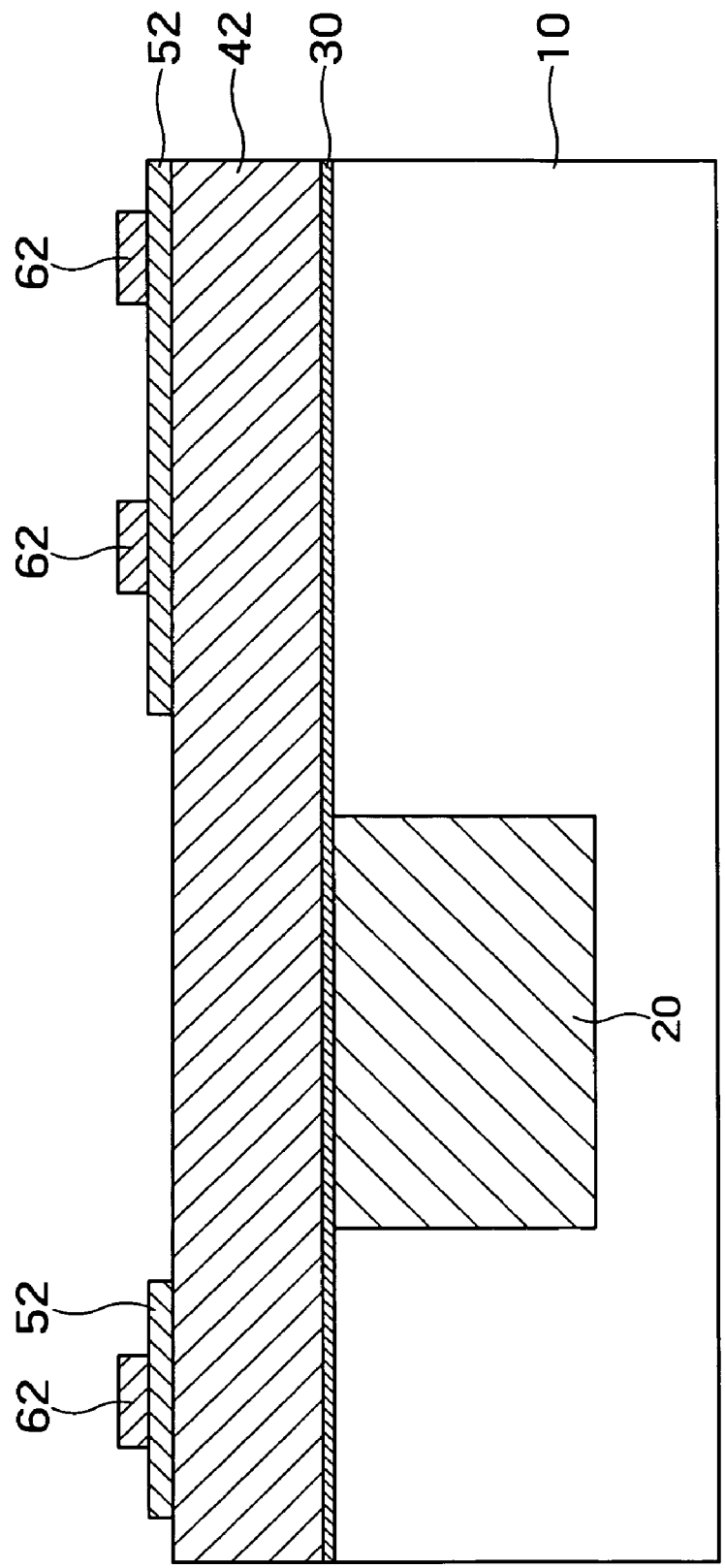

A photoresist film is coated on the silicon nitride film 52. Furthermore, the photoresist film is patterned so that, as shown in FIG. 9, a photoresist mask 93 having a preparatory pattern is formed. In this case, the preparatory pattern includes the gate electrode pattern, and covers a larger region than the gate electrode pattern. For example, the preparatory pattern may be a pattern covering an entire active area. In this case, in the step of forming the photoresist mask 93, the photomask in the step of forming the STI 20 can be used without being changed. Further, the preparatory pattern may also be a pattern having a region extended from the edge of the pattern of the gate electrode by a predetermined width, for example.

The silicon nitride film 52 is anisotropically etched in a preparatory pattern by RIE using the photoresist mask 93 as a mask. In this manner, the silicon nitride film 52 is patterned in the preparatory pattern. Thereafter, the photoresist mask 93 is removed to obtain a structure shown in FIG. 10.

Figure 11:
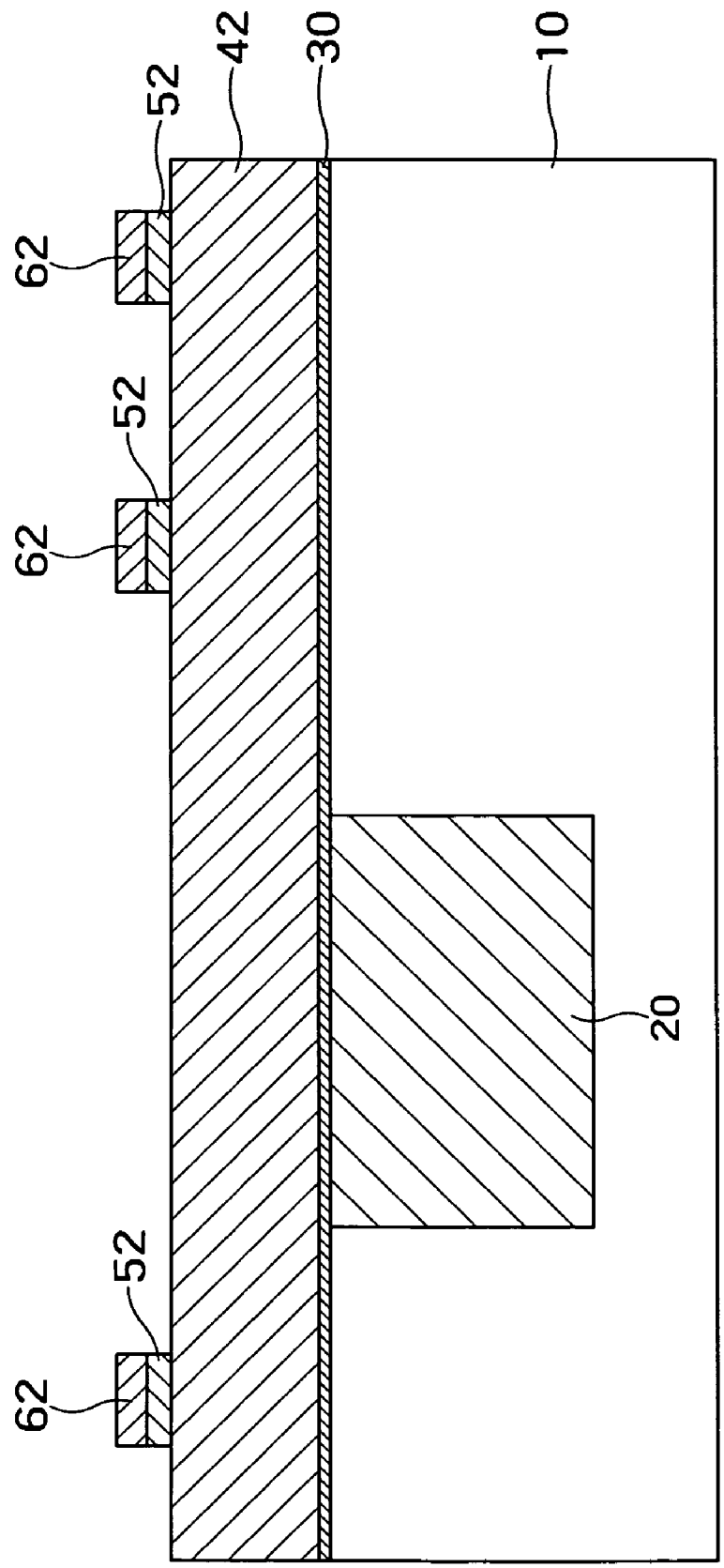
Figure 12:
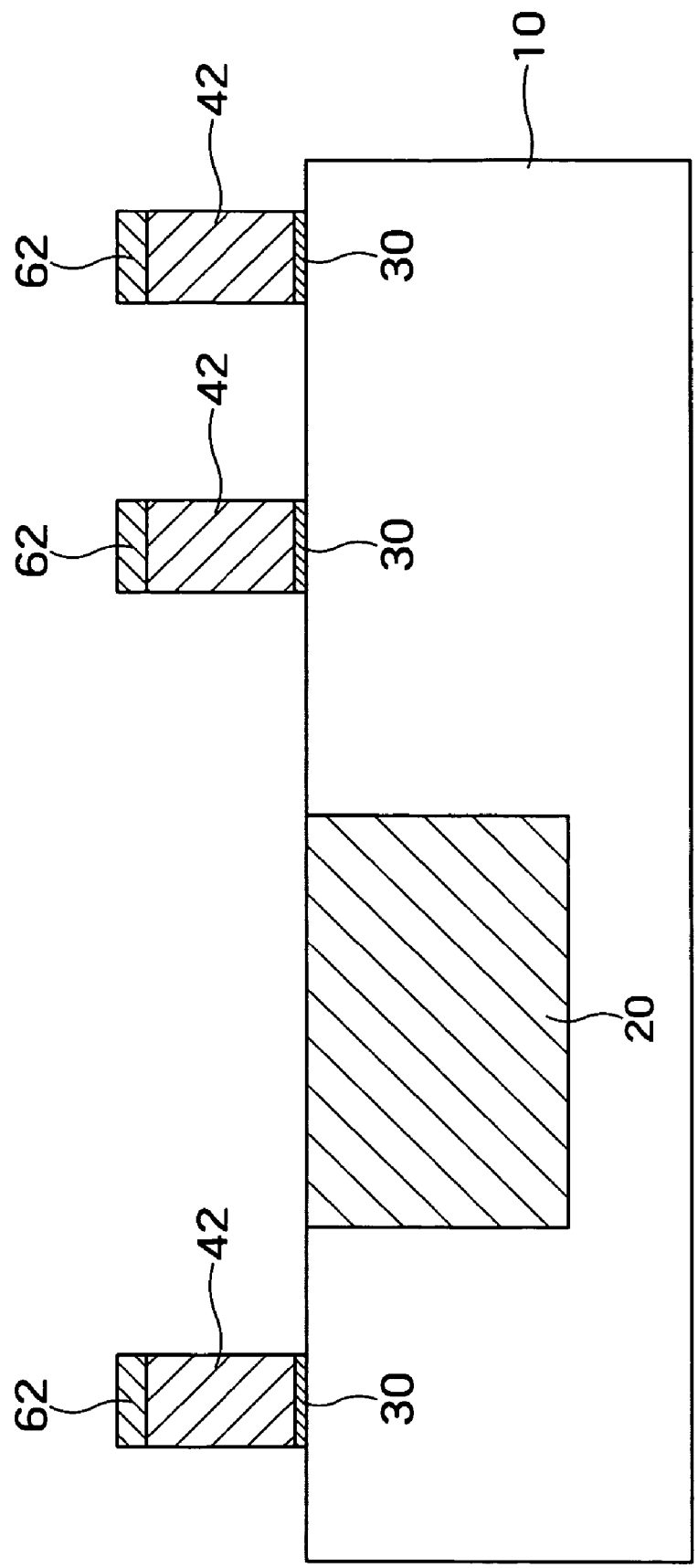

The silicon nitride film 52 is anisotropically etched in the pattern of the gate electrode by RIE using the amorphous silicon film 62 as a mask. In this manner, the silicon nitride film 52 is patterned in the gate electrode pattern. As a result, a structure shown in FIG. 11 is obtained.

Furthermore, a gate electrode material 42 is anisotropically etched by RIE using the silicon nitride film 52 as a mask. In this manner, the gate electrode is formed. Thereafter, a semiconductor device is completed through the known manufacturing processes.

In a conventional technique, after the silicon nitride film 52 and the amorphous silicon film 62 are deposited on the entire surface of the gate electrode material 42, the silicon nitride film 52 and the amorphous silicon film 62 are etched in one step to form a mask for a gate electrode. In this case, a reaction product (not shown) generated by reacting an etching gas of the RIE and the silicon nitride film 52 adheres to the side wall of the silicon nitride film 52. Since the etching amount is large in a low pattern density region, a large quantity of such reaction product is formed. The reaction product easily adheres to the side surface of the silicon nitride film 52 in a region having a low pattern density, and the width of the gate electrode 42 is larger than a desired width. As a result, the characteristics of semiconductor device are shifted from desired values.

In the second embodiment, the silicon nitride film 52 is etched in two steps. In this manner, an amount of reaction product, which is generated when the silicon nitride film 52 is patterned in a pattern of a gate electrode, is reduced. In particular, since a pattern having a region extended from the edge of the pattern of the gate electrode by a predetermined width is used as a preparatory pattern, the reaction product dramatically decreases in the region having a low pattern density. Therefore, the reaction product can be suppressed from adhering to the side surface of the silicon nitride film 52 regardless of the density of the pattern. As a result, the gate electrode having a desired width can be formed.

THIRD EMBODIMENT

FIGS. 13 to 19 are sectional views showing a method of manufacturing a semiconductor device according to a third embodiment of the present invention. In the third embodiment, trenches for an STI are formed by using a mask consisting of a silicon nitride film.

Figure 13:
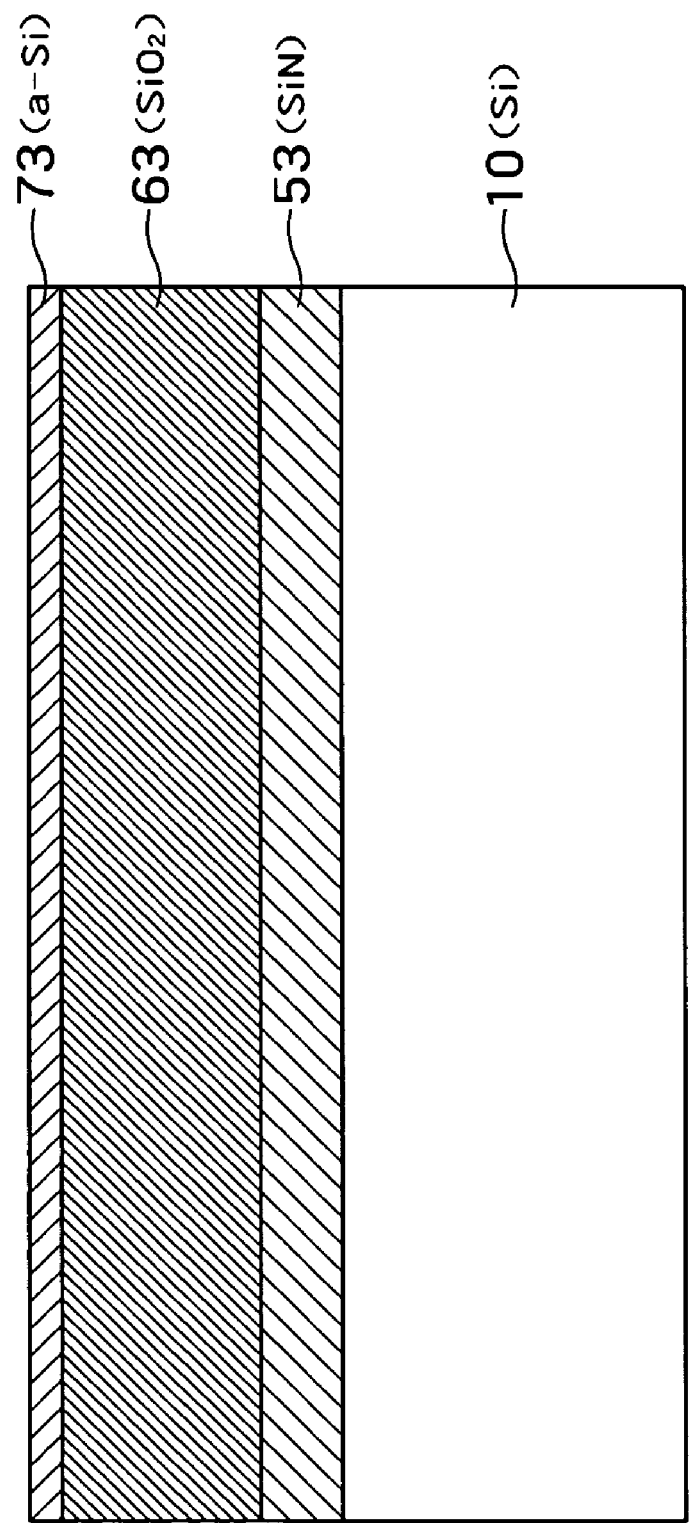
FIGS. 13 to 19 are sectional views showing a method of manufacturing a semiconductor device according to a third embodiment of the present invention.

As shown in FIG. 13, a silicon nitride film 53, a silicon oxide film 63, and an amorphous silicon film 73 are deposited on a silicon substrate 10 in this order. The silicon nitride film 53 is used as a mask material when trenches are formed.

Figure 14:
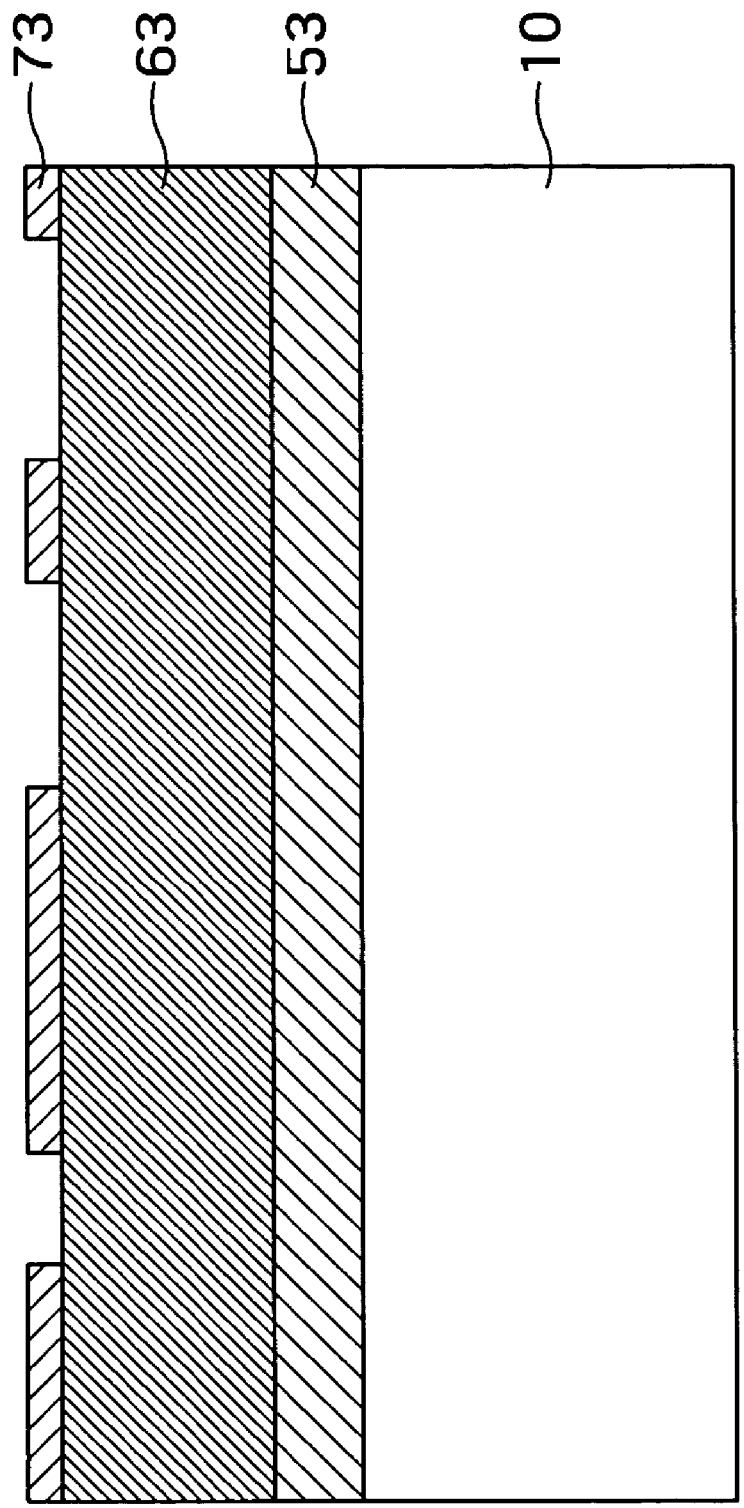
Figure 15:
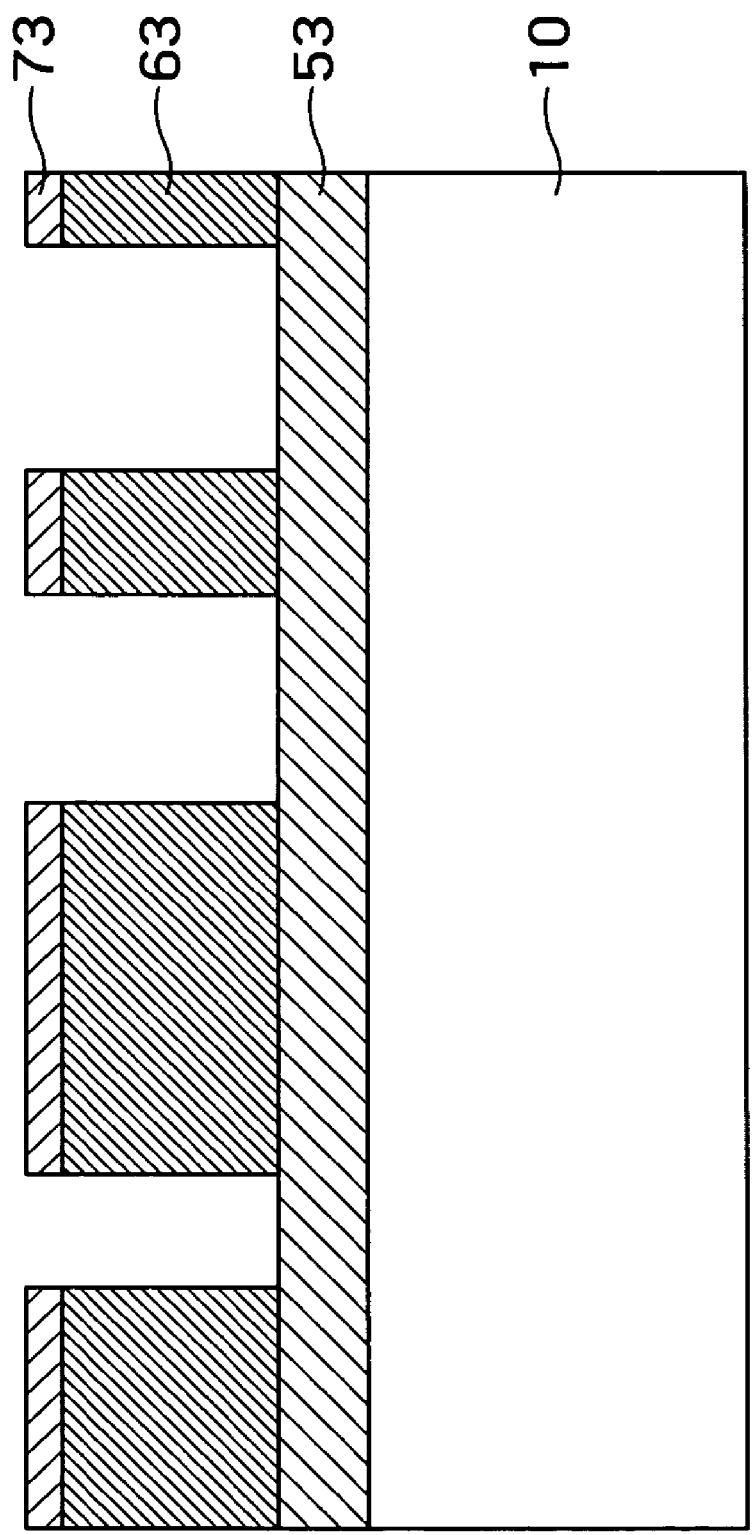

As shown in FIG. 14, the amorphous silicon film 73 is patterned in a pattern of trenches for an STI by using a photolithography technique and RIE. As shown in FIG. 15, the silicon oxide film 63 is anisotropically etched by RIE using the patterned amorphous silicon film 73 as a mask. The amorphous silicon does not easily generate a product in reaction with an etching gas of the RIE. Therefore, the amorphous silicon film 63 may be shaped in a pattern of a gate electrode by performing etching once.

Figure 16:
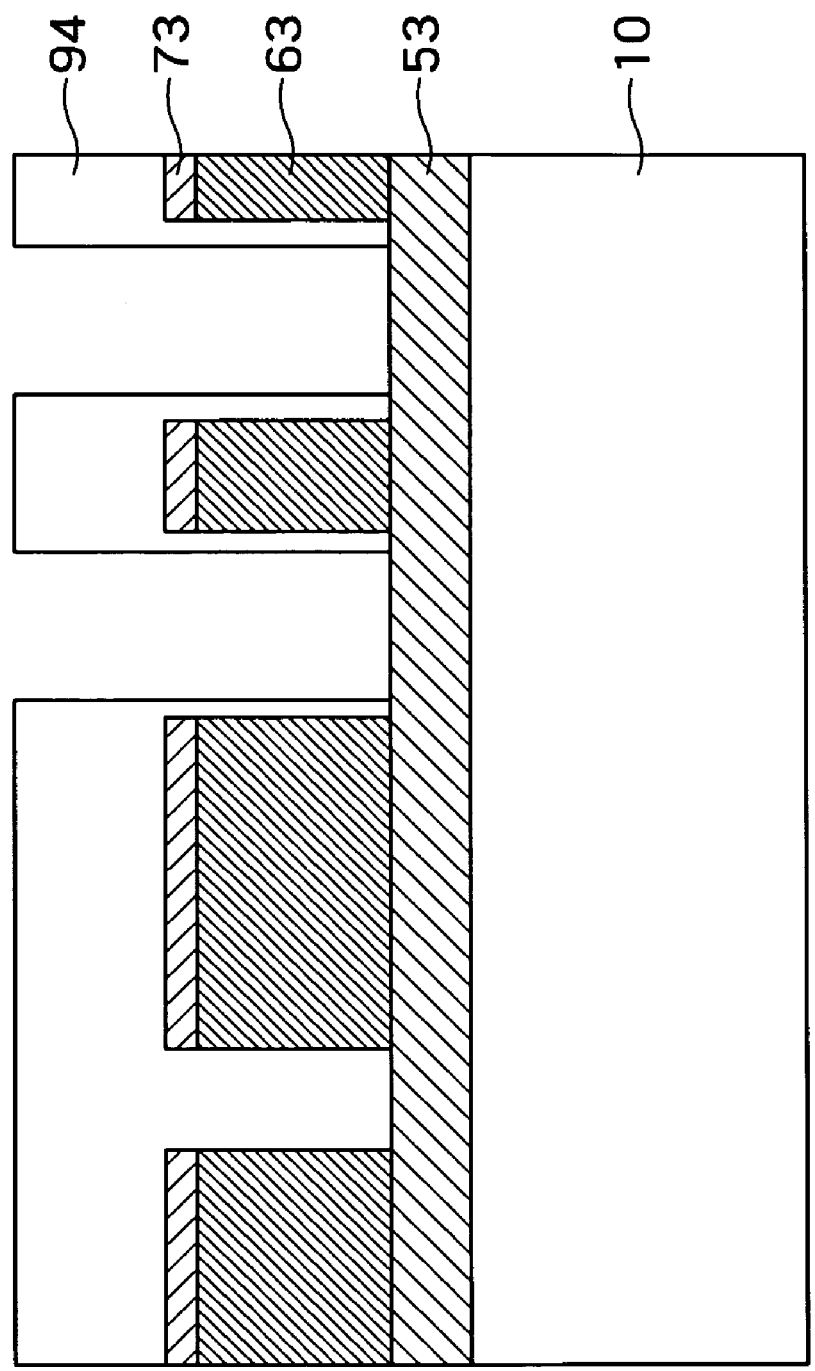
Figure 17:
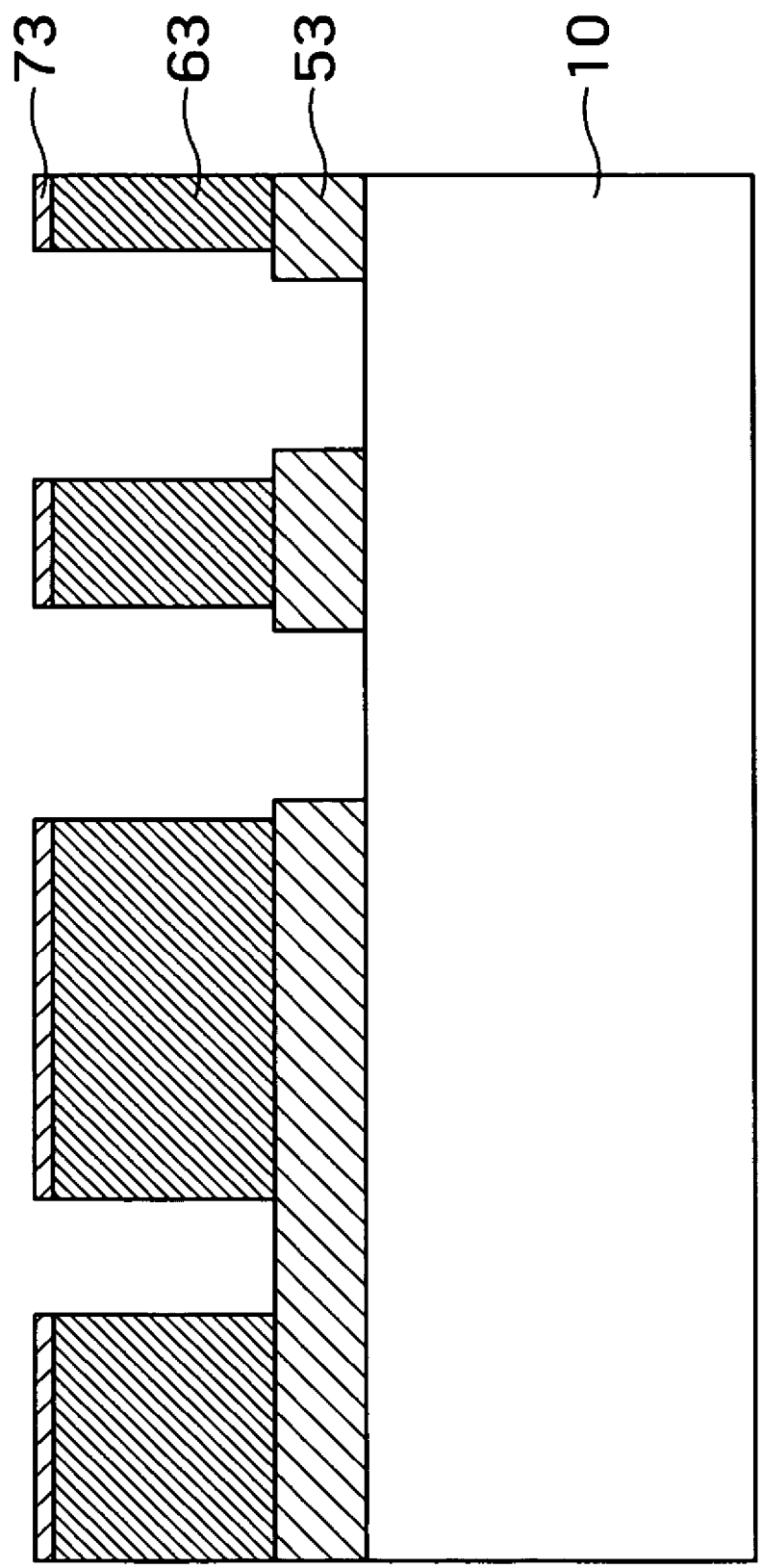

A photoresist is coated on the silicon nitride film 53. Furthermore, the photoresist film is patterned, so that, as shown in FIG. 16, a photoresist mask 94 having a preparatory pattern is formed. In this case, the preparatory pattern includes a pattern of trenches for an STI, and is a pattern having a region larger than the pattern of the trenches. For example, the preparatory pattern may be a pattern having a region extended from the edge of the pattern of the trenches by a predetermined width.

The silicon nitride film 53 is anisotropically etched in a preparatory pattern by RIE using the photoresist mask 94 as a mask. Thereafter, the photoresist mask 94 is removed to obtain a structure shown in FIG. 17.

Figure 18:
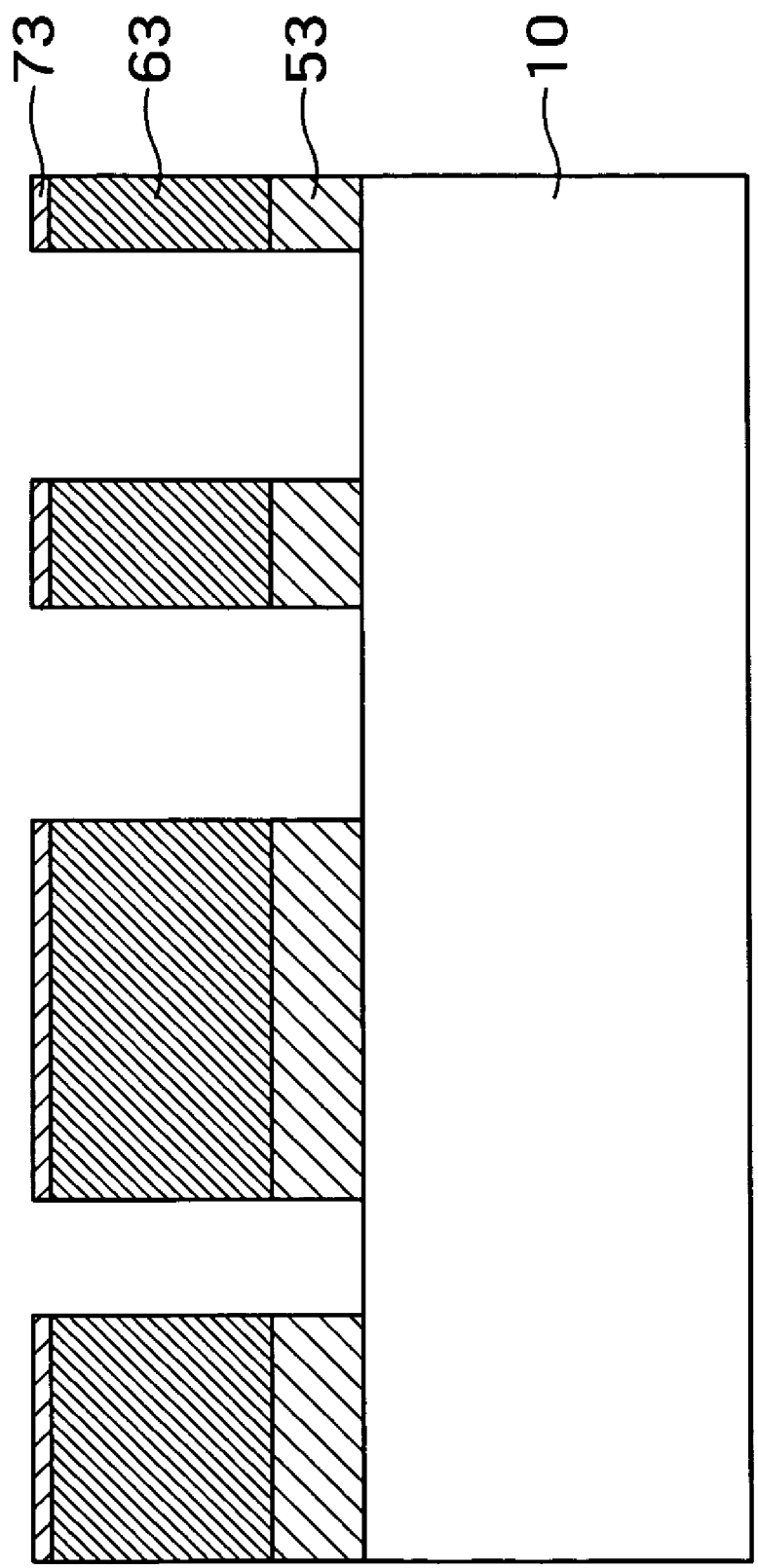

The silicon nitride film 53 is anisotropically etched in the pattern of the trenches for an STI by RIE using the amorphous silicon film 63 as a mask. In this manner, a structure shown in FIG. 18 is obtained. In the embodiment, the pattern of the trenches is a target pattern.

Figure 19:
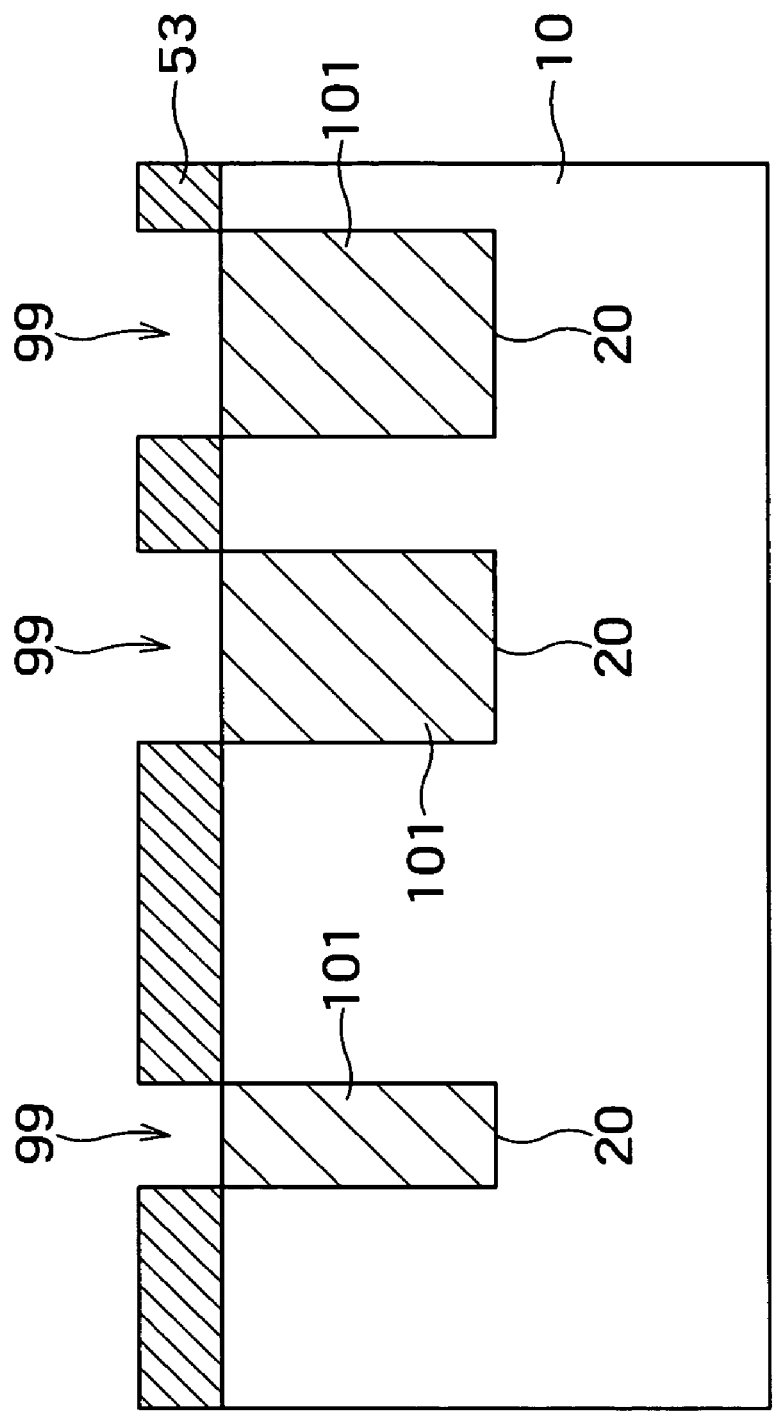

Furthermore, the silicon substrate 10 is anisotropically etched by RIE using the silicon nitride film 52 as a mask. In this manner, as shown in FIG. 19, trenches 99 for an STI are formed. Thereafter, an insulating material 101 is filled in the trenches 99 to complete an isolation region (STI) 20. Furthermore, a semiconductor device is completed through the known manufacturing processes.

In a conventional technique, after the silicon nitride film 53 and the amorphous silicon film 63 are deposited on the entire surface of the silicon substrate 10, the silicon nitride film 53 and the amorphous silicon film 63 are etched in one step. In this manner, a reaction product (not shown) generated by reacting an etching gas of the RIE and the silicon nitride film 53 adheres to the side wall of the silicon nitride film 53. In particular, as described above, the reaction product easily adheres to the side wall of the silicon nitride film 53 in a region having a low pattern density. For this reason, the width of each trench is smaller than a desired width.

In the third embodiment, the silicon nitride film 53 is etched in two steps. Therefore, an amount of reaction product, which is generated when the silicon nitride film 53 is patterned in the pattern of the trenches, decreases. In particular, since a pattern having a region extended from the edge of the pattern of the trenches by a predetermined width is used as a preparatory pattern, the reaction product dramatically decreases in the region having a low pattern density. Therefore, the reaction product can be suppressed from adhering to the side wall of the silicon nitride film 52 regardless of the density of the pattern. As a result, an STI having a desired width can be formed.

The invention claimed is:

1. A method of manufacturing a semiconductor device comprising:
   depositing a mask material to be patterned into a desired target pattern on an underlying material;
   patterning the mask material into a preparatory pattern including the target pattern and being larger than the target pattern;
   patterning the mask material into the target pattern; and
   processing the underlying material by using the mask material, which has been patterned, as a mask, wherein
   as a result of the patterning of the mask material into the preparatory pattern, the underlying material is exposed in a region of the target pattern having a relatively low density, and is unexposed in a region of the target pattern having a relatively high density.

2. A method of manufacturing a semiconductor device comprising:
   depositing a mask material to be patterned into a desired target pattern on an underlying material;
   patterning the mask material into a preparatory pattern including the target pattern and being larger than the target pattern;
   patterning the mask material into the target pattern; and
   processing the underlying material by using the mask material, which has been patterned, as a mask, wherein
   as a result of the patterning of the mask material into the preparatory pattern, the underlying material is exposed in isolation regions, and is unexposed in element-forming regions.

3. A method of manufacturing a semiconductor device comprising:
   depositing a mask material to be patterned into a desired target pattern on an underlying material;
   patterning the mask material into a preparatory pattern including the target pattern and being larger than the target pattern;
   patterning the mask material into the target pattern; and
   processing the underlying material by using the mask material, which has been patterned, as a mask, wherein
   the underlying material is a material of a semiconductor substrate,
   the method further comprising:
   forming an isolation region and an element-forming region on the semiconductor substrate; and
   forming a gate insulation film on a surface of the element-forming region of the semiconductor substrate, and simultaneously forming a gate electrode on the gate insulation film; wherein
   the mask material is deposited on an upper surface of the gate electrode, a side surface of the gate electrode, and the semiconductor substrate,
   the mask material on the isolation region is removed to pattern the mask material into the preparatory pattern,
   the mask material is anisotropically etched such that the mask material is left on the side surface of the gate electrode to pattern the mask material into the target pattern, and
   an impurity is implanted into the semiconductor substrate by using the mask material as a mask to form a source layer and a drain layer.

4. The method of manufacturing a semiconductor device according to claim 3, wherein
   the gate electrode is formed of polysilicon, and the mask material is formed of one of or both of silicon oxide and silicon nitride.

5. The method of manufacturing a semiconductor device according to claim 1, wherein
   the underlying material is a material of a semiconductor substrate,
   the method further comprising:
   forming an isolation region and an element-forming region on the semiconductor substrate; and
   forming a gate insulation film on a surface of the element-forming region of the semiconductor substrate, and simultaneously forming a gate electrode on the gate insulation film; wherein
   the mask material is deposited on an upper surface of the gate electrode, a side surface of the gate electrode, and the semiconductor substrate, the mask material on the isolation region is removed to pattern the mask material into the preparatory pattern, the mask material is anisotropically etched such that the mask material is left on the side surface of the gate electrode to pattern the mask material into the target pattern, and an impurity is implanted into the semiconductor substrate by using the mask material as a mask to form a source layer and a drain layer.

6. The method of manufacturing a semiconductor device according to claim 5, wherein the gate electrode is formed of polysilicon, and the mask material is formed of one of or both of silicon oxide and silicon nitride.

7. A method of manufacturing a semiconductor device comprising:

depositing a mask material to be patterned into a desired target pattern on an underlying material;

patterning the mask material into a preparatory pattern including the target pattern and being larger than the target pattern;

patterning the mask material into the target pattern; and processing the underlying material by using the mask material, which has been patterned, as a mask, wherein the underlying material is a gate electrode material, the method further comprising:

forming an isolation region and an element-forming region on a semiconductor substrate;

forming a gate insulation film on an element-forming region of the semiconductor substrate;

depositing the gate electrode material on the gate insulation film; and depositing a mask material on the gate electrode material; wherein the mask material is patterned into a preparatory pattern including the target pattern of a gate electrode and being larger than the target pattern of the gate electrode, the mask material is patterned into the target pattern of the gate electrode, and the gate electrode material is etched into the target pattern of the gate electrode by using the patterned mask material as a mask.

8. The method of manufacturing a semiconductor device according to claim 7, wherein the gate electrode material is formed of polysilicon, and the mask material is formed of silicon nitride.

9. The method of manufacturing a semiconductor device according to claim 1, wherein the underlying material is a gate electrode material, the method further comprising:

forming an isolation region and an element-forming region on a semiconductor substrate;

forming a gate insulation film on an element-forming region of the semiconductor substrate;

depositing the gate electrode material on the gate insulation film; and depositing a mask material on the gate electrode material; wherein the mask material is patterned into a preparatory pattern including the target pattern of a gate electrode and being larger than the target pattern of the gate electrode, the mask material is patterned into the target pattern of the gate electrode, and the gate electrode material is etched into the target pattern of the gate electrode by using the patterned mask material as a mask.

10. The method of manufacturing a semiconductor device according to claim 9, wherein the gate electrode material is formed of polysilicon, and the mask material is formed of silicon nitride.

11. A method of manufacturing a semiconductor device comprising:

depositing a mask material to be patterned into a desired target pattern on an underlying material;

patterning the mask material into a preparatory pattern including the target pattern and being larger than the target pattern;

patterning the mask material into the target pattern; and processing the underlying material by using the mask material, which has been patterned, as a mask, wherein the underlying material is a material of a semiconductor substrate, the method further comprising:

depositing a mask material on the semiconductor substrate, wherein the mask material is patterned into a preparatory pattern including the target pattern of an element-forming region and being larger than the target pattern of the element-forming region, the mask material is patterned into the target pattern of the element-forming region, the semiconductor substrate is etched by using the mask material as a mask to form a trench, and an insulation material is filled in the trench to form an insulation region.

12. The method of manufacturing a semiconductor device according to claim 11, wherein the mask material is formed of silicon nitride.

13. The method of manufacturing a semiconductor device according to claim 1, wherein the underlying material is a material of a semiconductor substrate;

the method further comprising:

depositing a mask material on the semiconductor substrate; wherein the mask material is patterned into a preparatory pattern including the target pattern of an element-forming region and being larger than the target pattern of the element-forming region, the mask material is patterned into the target pattern of the element-forming region, the semiconductor substrate is etched by using the mask material as a mask to form a trench, and an insulation material is filled in the trench to form an insulation region.

14. The method of manufacturing a semiconductor device according to claim 13, wherein the mask material is formed of silicon nitride.

* * * * *